(12) United States Patent
Shringarpure et al.

(10) Patent No.: US 10,840,857 B2
(45) Date of Patent: *Nov. 17, 2020

(54) SELF BIASED DUAL MODE DIFFERENTIAL CMOS TIA FOR 400G FIBER OPTIC LINKS

(71) Applicant: INPHI CORPORATION, Santa Clara, CA (US)

(72) Inventors: Rahul Shringarpure, Santa Clara, CA (US); Tom Peter Edward Broekaert, Santa Clara, CA (US); Gaurav Mahajan, Santa Clara, CA (US)

(73) Assignee: INPHI CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,880

(22) Filed: Mar. 11, 2019

(65) Prior Publication Data

US 2019/0207568 A1 Jul. 4, 2019

Related U.S. Application Data

(63) Continuation of application No. 15/708,930, filed on Sep. 19, 2017, now Pat. No. 10,270,403, which is a (Continued)

(51) Int. Cl.
*H03F 3/08* (2006.01)
*H03F 3/45* (2006.01)
(Continued)

(52) U.S. Cl.
CPC ............ *H03F 3/082* (2013.01); *H03F 1/0205* (2013.01); *H03F 3/087* (2013.01);
(Continued)

(58) Field of Classification Search
CPC .... H03F 3/082; H03F 1/0205; H03F 3/45475; H03F 3/087; H03F 3/45179; H03F 2200/555; H04B 10/693; H04B 10/616
(Continued)

(56) References Cited

U.S. PATENT DOCUMENTS 8,018,251 B1 * 9/2011 Boyd ................. H03K 19/0175
326/80
2006/0202766 A1 * 9/2006 Kwa .................... H03G 1/0029
330/308

(Continued)

*Primary Examiner* — Seung C Sohn
(74) *Attorney, Agent, or Firm* — Richard T. Ogawa; Ogawa P.C.

(57) ABSTRACT

A transimpedance amplifier (TIA) device. The device includes a photodiode coupled to a differential TIA with a first and second TIA, which is followed by a Level Shifting/ Differential Amplifier (LS/DA). The photodiode is coupled between a first and a second input terminal of the first and second TIAs, respectively. The LS/DA can be coupled to a first and second output terminal of the first and second TIAs, respectively. The TIA device includes a semiconductor substrate comprising a plurality of CMOS cells, which can be configured using 28 nm process technology to the first and second TIAs. Each of the CMOS cells can include a deep n-type well region. The second TIA can be configured using a plurality CMOS cells such that the second input terminal is operable at any positive voltage level with respect to an applied voltage to a deep n-well for each of the plurality of second CMOS cells.

20 Claims, 9 Drawing Sheets

Related U.S. Application Data continuation of application No. 14/987,673, filed on Jan. 4, 2016, now Pat. No. 9,793,863, which is a continuation of application No. 14/340,388, filed on Jul. 24, 2014, now Pat. No. 9,264,001.

(60) Provisional application No. 61/882,576, filed on Sep. 25, 2013.

(51) Int. Cl.
    *H04B 10/61*     (2013.01)
    *H04B 10/69*     (2013.01)
    *H03F 1/02*     (2006.01)

(52) U.S. Cl.
    CPC ..... *H03F 3/45179* (2013.01); *H03F 3/45475* (2013.01); *H04B 10/616* (2013.01); *H04B 10/693* (2013.01); *H03F 2200/555* (2013.01)

(58) Field of Classification Search
    USPC .......................................... 250/551
    See application file for complete search history.

(56) References Cited

U.S. PATENT DOCUMENTS

| | | | |
|---|---|---|---|
| 2010/0019132 A1* | 1/2010 | Uo | H03F 1/30 250/214 R |
| 2010/0166117 A1* | 7/2010 | Choi | H04L 25/0292 375/340 |
| 2012/0175690 A1* | 7/2012 | Hsin | H01L 31/103 257/290 |
| 2013/0285203 A1* | 10/2013 | Hiroi | H01L 23/5329 257/532 |
| 2015/0001404 A1* | 1/2015 | Lau | G01T 1/208 250/363.03 |

* cited by examiner

| Performance Metrics at 35°C (CMOS TIA's are Differential) | 28nm CMOS TIA Ultra-Low $V_T$ | | 45nm CMOS TIA Low $V_T$ | | BiCMOS TIA 130nm SiGe HBT (1st Stage of TA2841) |
|---|---|---|---|---|---|
| Technology TIA Topology | TSMC 28nm (TIA + 1 Gain Stage) | | TSMC 45nm (TIA + 2 Gain Stages) | | 130nm SiGe HBT |
| | 28G TIA | 10G TIA | 28G TIA | 10G TIA | |
| $Z_T$ (Ω) at 1GHz | 1.053K | 1.84K | 1.016K | 1.85K | 779 |
| TIA BW GHz | 18.0 | 11.0 | 17.4 | 12.4 | 17.2 |
| Opt. BW GHz | 12.2 | 6.5 | 14.4 | 5.9 | 10.2 |
| $I_{in,noise}$ (µA) | 1.52 | 0.97 | 1.67 | 1.12 | $1.44 \times \sqrt{2} = 2.06$ |
| DDJitter (ps) at Iin=100uA | 2.48 | 0.145 | 4.52 | 0.301 | < 3ps at 28G |
| $I_{dissipation}$ (mA) $V_{cc}$=1V | 13.8 | 13.8 | 15.4 | 15.4 | (8.2 mA at Vcc = 3.3V) = 26.4mA |

FIG. 5

28nm CMOS TIA

45nm CMOS TIA

SELF BIASED DUAL MODE DIFFERENTIAL CMOS TIA FOR 400G FIBER OPTIC LINKS

CROSS-REFERENCES TO RELATED APPLICATIONS

This application is a continuation of U.S. patent application Ser. No. 15/708,930, filed Sep. 19, 2017, which a continuation of U.S. patent application Ser. No. 14/987,673, filed Jan. 4, 2016, now issued as U.S. Pat. No. 9,793,863 on Oct. 17, 2017, which is a continuation of U.S. patent application Ser. No. 14/340,388, filed Jul. 24, 2014, now issued as U.S. Pat. No. 9,264,001 on Feb. 16, 2016, which claims priority to and incorporates by reference, for all purposes, the following provisional application: U.S. Provisional Application No. 61/882,576, filed Sep. 25, 2013.

BACKGROUND OF THE INVENTION

The present invention relates to communication systems and integrated circuit (IC) devices. More particularly, the present invention provides an integrated transimpedance amplifier device and method therefor.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication systems implementing Optical Fiber Links. As CMOS technology is scaled down to make circuits and systems run at higher speed and occupy smaller chip (die) area, the operating supply voltage is reduced for lower power. Conventional FET transistors in deep-submicron CMOS processes have very low breakdown voltage as a result the operating supply voltage is maintained around 1 Volt. The Photo-detectors (PD) used in 28 G and 10 G Optical Receivers require a bias voltage of more than 2 Volts across the anode and cathode nodes of the PD for better photo-current responsivity. These limitations provide significant challenges to the continued improvement of communication systems scaling and performance.

There have been many types of communication systems and methods. Unfortunately, they have been inadequate for various applications. Therefore, improved communication systems and methods are desired.

BRIEF SUMMARY OF THE INVENTION

The present invention is directed to communication systems and integrated circuit (IC) devices. More specifically, various embodiments of the present invention provide a fully differential self-biased transimpedance amplifier (TIA) device configured with deep n-well regions.

Future 1 THz and 400 GHz Optical Fiber Links will have multiple channels with 28 G and 10 G Optical Receivers (Rx) on a single silicon chip implemented in a high-speed deep-submicron CMOS technology. As CMOS technology is scaled down to make circuits and systems run at higher speed and occupy smaller chip (die) area, the operating supply voltage is reduced for lower power. Conventional FET transistors in deep-submicron CMOS processes have very low breakdown voltage, as a result the operating supply voltage is maintained around 1 Volt. The Photo-detectors (PD) used in 28 G and 10 G Optical Receivers require a bias voltage of more than 2 Volts across the anode and cathode nodes of the PD for better photo-current responsivity.

In an embodiment, the present invention provides a transimpedance amplifier (TIA) device or a system provided on a single integrated circuit (IC) chip device. The device or system includes a photodiode coupled to a differential TIA, which is followed by a Level Shifting/Differential Amplifier (LS/DA). The differential TIA includes a first TIA and a second TIA. The first TIA can include a first input terminal and a first output terminal. Similarly, the second TIA can include a second input terminal and a second output terminal. The photodiode is coupled between the first input terminal and the second input terminal. The LS/DA can be coupled to the first output terminal and the second output terminal.

In an embodiment, the present invention provides a self-biased differential TIA device. The TIA device includes a semiconductor substrate comprising a plurality of CMOS cells. These CMOS cells can be configured using a 28 nm process technology. Each of the CMOS cells can include a deep n-type well region. The first TIA can be configured using a plurality of first CMOS cells, while the second TIA can be configured using a plurality of second CMOS cells such that the second input terminal is operable at any positive voltage level with respect to an applied voltage to a deep n-well for each of the plurality of second CMOS cells.

Using the deep n-well regions, the differential TIA can be self-biased with customizable bias voltages at the TIA inputs. Any positive voltage level can be used (2V, 3V, 5V, etc.) as long as there is 1V across the TIA and there is a differential voltage between the inputs of the first and second TIA of at least 2-5V. The photodiode can be characterized by a responsivity value ranging from about 0.6 to about 0.9 Amps/Watt.

Typically, in existing high speed TIA's the PD is AC-coupled to the trans-impedance amplifier (TIA) and/or external voltage is used to bias the PD. AC-coupling between PD and TIA reduces the system sensitivity. Moreover, with multiple channels (over 50 channels in conventional embodiments) the external bias circuits add to the system complexity and increases the module cost. Embodiments of the present invention eliminate the need of external bias circuits and all bias voltages to the PD will be internally generated by the CMOS TIA. Additionally, the architecture described here AC-couples the PD to the TIA reducing noise and improving sensitivity.

Many benefits are recognized through various embodiments of the present invention. Such benefits include having low inductance radio frequency (RF) return, improved receiver stability, and signal integrity. These benefits can enable higher Zt designs of communications IC chip devices with improved RX sensitivity, or receive sensitivity. In a specific embodiment, the differential approach offers a 1.5 dB SNR improvement. Being in a differential configuration also offers common mode rejection (if such a signal is present) and can also enhance linearity as differential architectures allow for even order harmonic suppression. Other benefits will be recognized by those of ordinary skill in the art that the mechanisms described can be applied to other communications systems as well.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which:

FIG. 5 is a simplified table describing characteristics of transimpedance amplifier devices according to various embodiments of the present invention.

DETAILED DESCRIPTION OF THE INVENTION

The present invention is directed to transimpedance amplifier (TIA) devices and systems configured on a single integrated circuit (IC) chip device. More specifically, various embodiments of the present invention provide a self-biased transimpedance amplifier (TIA) device.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1A:
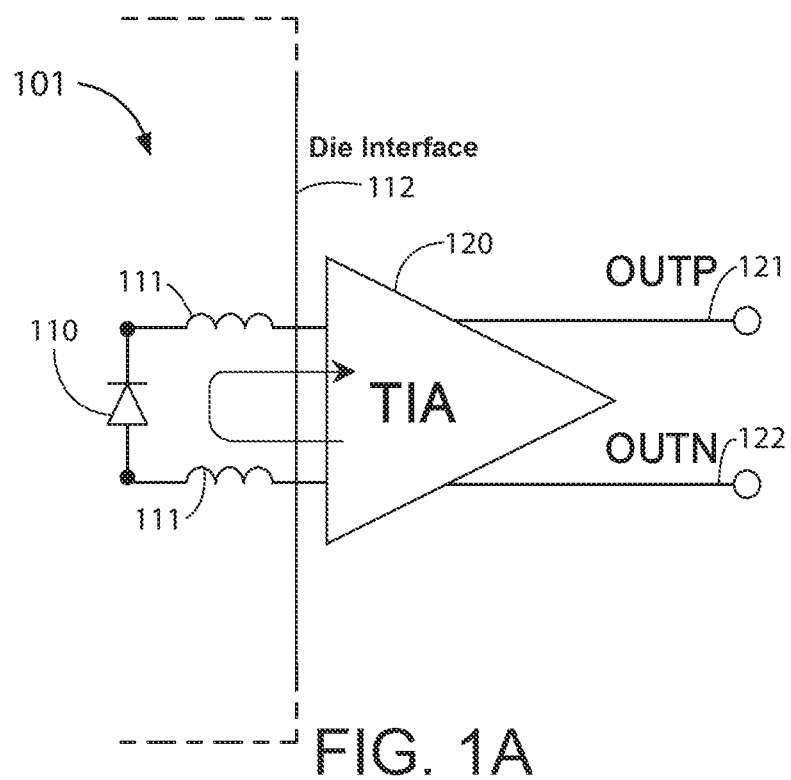
FIG. 1A is a simplified block diagram of a transimpedance amplifier device (TIA) according to an embodiment of the present invention.
Figure 1B:
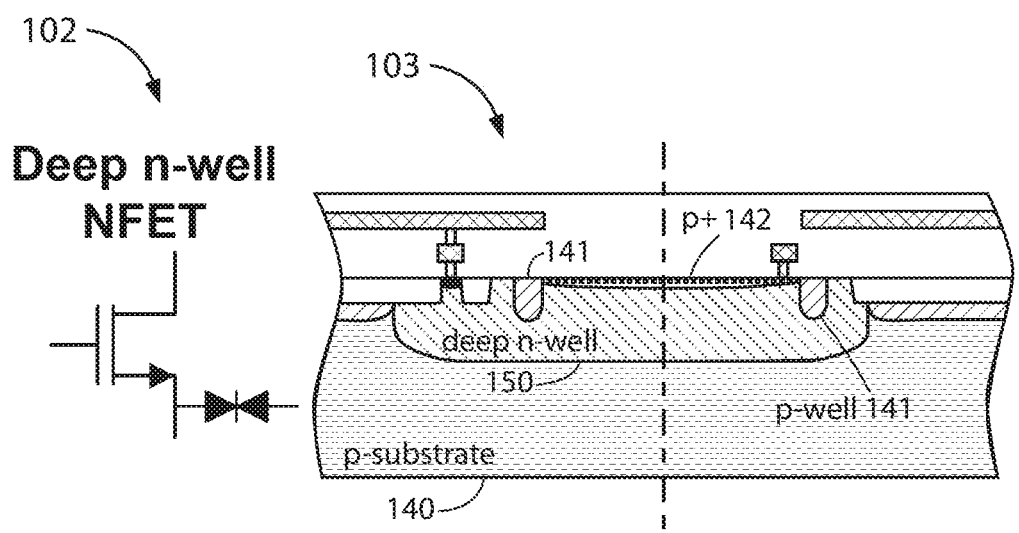
FIG. 1B is a simplified diagram illustrating a deep n-well NFET device according to an embodiment of the present invention.

FIG. 1A is a simplified block diagram of a transimpedance amplifier device (TIA) according to an embodiment of the present invention. As shown, device 101 includes a TIA 120 coupled to a photodiode 110. The photo diode 110 is coupled to inductors 111 that are coupled to the TIA 120 and the photodiode 110 and inductors 111 are shown on the die interface 112. The TIA 120 has a first output terminal OUTP 121 and a second output terminal OUTN 122. In an embodiment, the TIA 120 can be provided in differential self-biased configuration including one or more deep n-well NFET devices, which are shown in FIG. 1B. Differential TIA's can be stacked between multiple supply rails providing a predetermined bias voltage across the photodiode 110.

FIG. 1B is a simplified diagram illustrating a deep n-well NFET device according to an embodiment of the present invention. As shown, NFET 102, represented as a transistor symbol, is shown in a cross-sectional view 103 providing greater detail. The deep n-well NFET is configured on a p-substrate 140 with a deep n-well region 150 overlying the p-substrate 140. A p+ region 142 and one or more p-well regions 141 are configured within one or more portions of the deep n-well region 150.

An advantage of the deep n-well devices 102, which can be provided in a 28 nm process, is that these deep n-well devices can be floated to any positive voltage for various applications, such as telecommunications and the like. The device 101, shown in FIG. 1A, implementing these deep n-well devices can include benefits such as having low inductance radio frequency (RF) return, improved receiver stability, and signal integrity. These benefits can enable higher Zt designs of communications IC chip devices with improved RX sensitivity, or receive sensitivity. In a specific embodiment, the differential approach offers a 1.5 dB SNR improvement. Being in a differential configuration also offers common mode rejection (if such a signal is present) and can also enhance linearity as differential architectures allow for even order harmonic suppression. Other benefits will be understood by those of ordinary skill in the art.

Figure 2:
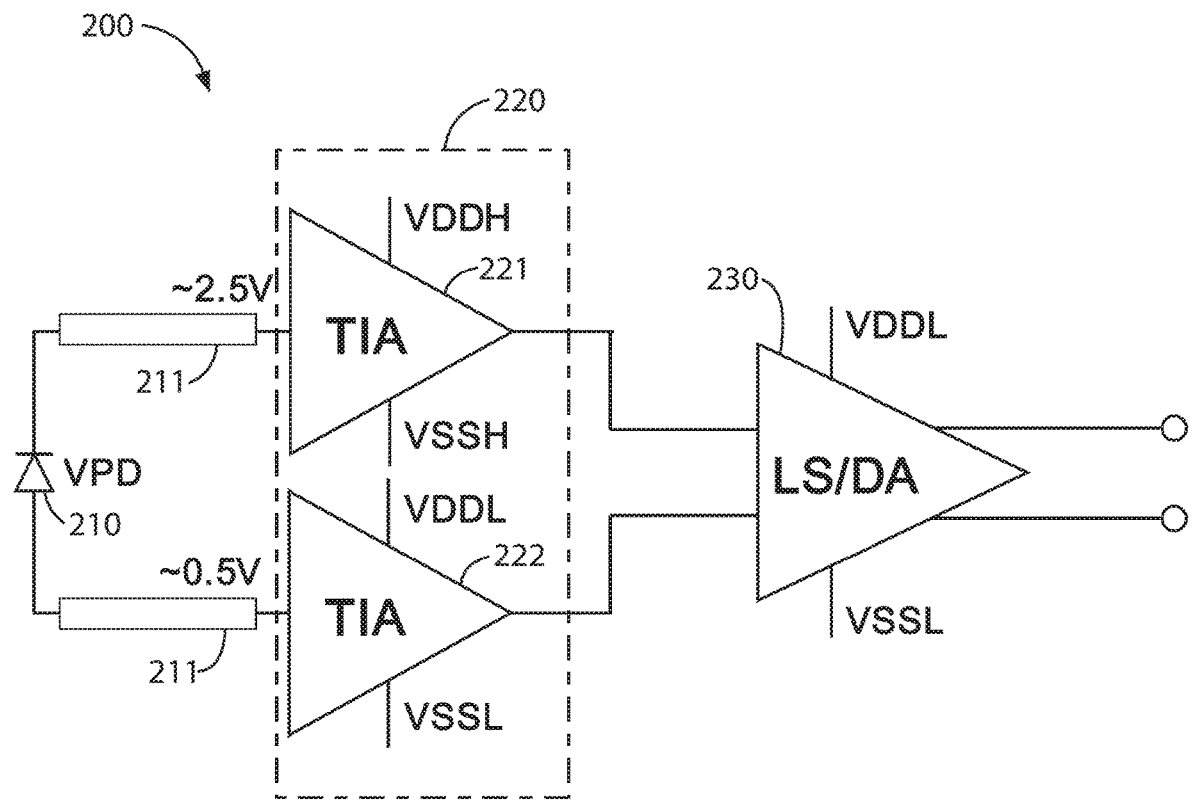
FIG. 2 is a simplified block diagram illustrating a transimpedance amplifier device according to an embodiment of the present invention.

FIG. 2 is a simplified block diagram illustrating a transimpedance amplifier device according to an embodiment of the present invention. As shown, the device 200 includes a photodiode 210 coupled to a differential TIA 220, which is followed by a Level Shifting/Differential Amplifier (LS/DA) 230. The differential TIA 220 includes a first TIA 222 and a second TIA 221. The first TIA 222 can include a first input terminal and a first output terminal. Similarly, the second TIA 221 can include a second input terminal and a second output terminal. The photodiode 210 is coupled between the first input terminal and the second input terminal, shown at nodes 211. The LS/DA 230 can be coupled to the first output terminal and the second output terminal.

In an embodiment, the present invention provides a self-biased differential TIA device. The TIA device includes a semiconductor substrate comprising a plurality of CMOS cells. These CMOS cells can be configured using a 28 nm process technology. Each of the CMOS cells can include a deep n-type well region, as described previously in FIG. 1B. The first TIA 222 can be configured using a plurality of first CMOS cells, while the second TIA 221 can be configured using a plurality of second CMOS cells such that the second input terminal is operable at any positive voltage level with respect to an applied voltage to a deep n-well for each of the plurality of second CMOS cells.

Using the deep n-well regions, the differential TIA 220 can be self-biased with customizable bias voltages at the TIA inputs. Any positive voltage level can be used (2V, 3V, 5V, etc.) as long as there is 1V across the TIA and there is a differential voltage between the inputs of the first and second TIA of at least 2-5V. The photodiode can be characterized by a responsivity value ranging from about 0.6 to about 0.9 Amps/Watt.

In a specific embodiment, each of the first TIA and the second TIA can be provided with a supply voltage that is independent of a photodiode differential voltage provided on the first input terminal and the second input terminal. As shown in FIG. 2, the first TIA 222 includes a VDDL level and a VSSL level while the second TIA 221 includes a VDDH level and a VSSH level. The LS/DA 230 is also shown with a VDDL level and a VSSL level. Due to the self-biased configuration of the TIAs, these upper and lower supply voltages can be independent of the photodiode bias voltage or the photodiode differential voltage.

In FIG. 2, the VDDH level is about 3V, VSSH is about 2V, VDDL is about 1V, and VSSL is at 0V. The input TIA bias is at about between the VDD/VSS rails, which results in a roughly 2V reverse bias over the photodiode 210. In an embodiment, the high-side TIA (second TIA) current can be recycled to low-side TIA. High-side level shifting can be achieved with AC coupling on the high-side (second TIA) and low-side (first TIA) TIAs to the LS/DA to have reduced or minimum skew. The VPD (photodiode) reverse bias range is about 1 to 2V for VDDH in the 2 to 3V range. AC coupling to the LS/DA enables the wide bias range. In various embodiments, the determined bias ranges and values can depend on the type of application or characteristics of the process technology.

Figure 3:
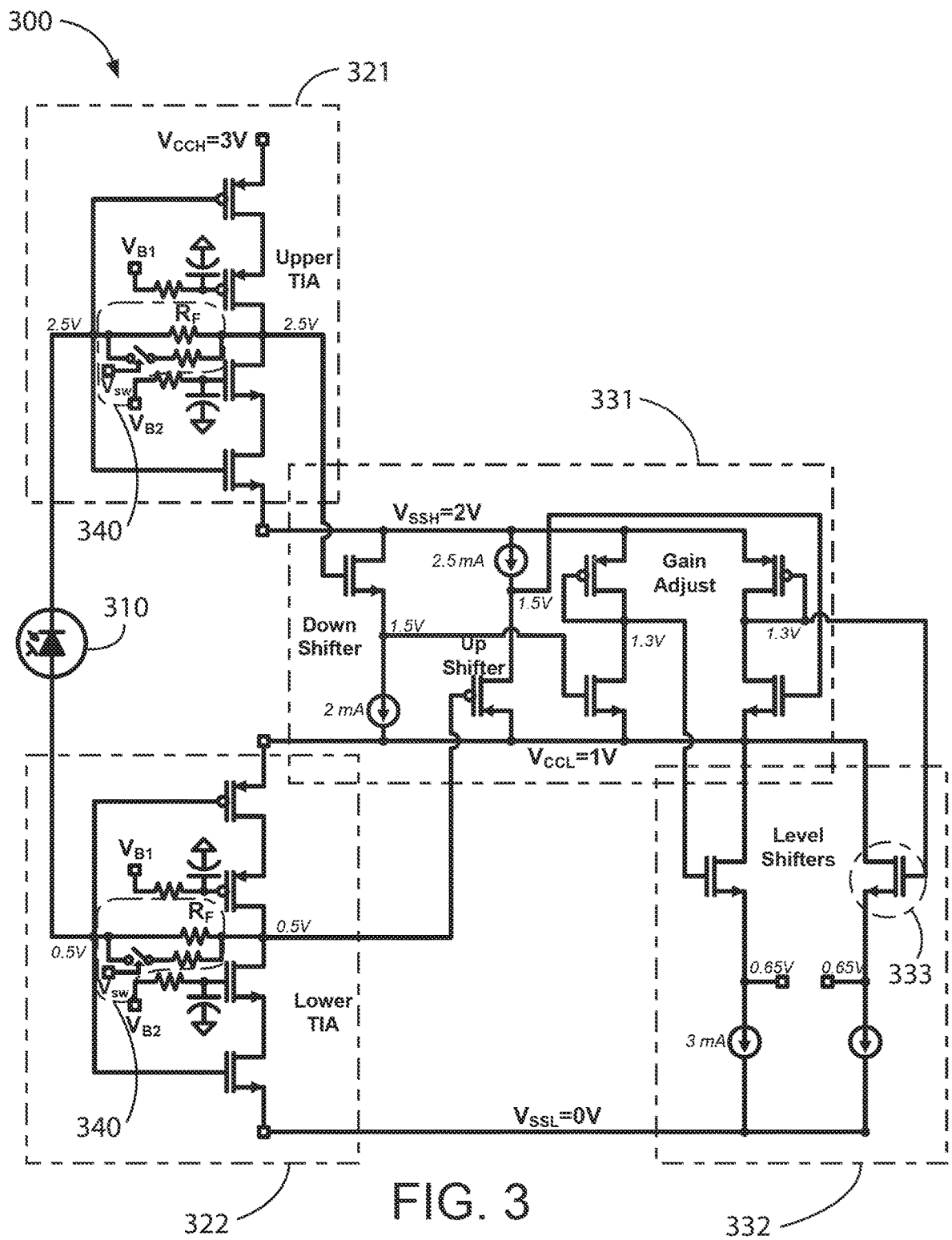
FIG. 3 is a simplified circuit diagram illustrating a fully differential transimpedance amplifier device according to an embodiment of the present invention.

FIG. 3 is a simplified circuit diagram illustrating a fully differential transimpedance amplifier device according to an embodiment of the present invention. As shown, device 300 includes a photodiode 310 coupled to a first TIA 322 and a second TIA 321. The first and second TIAs are coupled to a LS/DA, which includes modules 331 and 332. Module 331 of the LS/DA includes an up-shifting device and a down-shifting device configured to mitigate any mismatch in data bits between the first TIA and the second TIA. The LS/DA can include a differential amplifier having a differential voltage output and can be configured with a level shifter, as shown in module 332. A gain amplifier (gain adjust) can also be provided to correct any losses from either the up-shifting device of the down-shifting device. As an example, transistor 333 is marked to be a deep n-well NFET as shown in FIG. 1B.

This embodiment includes the benefits of being able to float the n-wells at positive voltages allowing for the differential TIAs 321/322 to be stacked between multiple supply rails providing a 2V bias across the photodiode 310. Furthermore, each of the TIAs 321/322 includes a switch mechanism 340 including Vsw, a switch element, and Rf resistors. These switches provide dual-mode operations in two different bit rates (e.g. 10 G and 28 G, or the like).

In an embodiment, the present invention can provide a transimpedance amplifier (TIA) device. The device can include a semiconductor circuit having a plurality of CMOS cells. Each of these CMOS cells can include a deep n-type well region. In a specific embodiment, the plurality of CMOS cells is configured using a 28 nm process technology.

The device can also include a first TIA being configured using a plurality of first CMOS cells and second TIA being configured using a plurality of second CMOS cells. The first TIA includes a first input terminal and a first output terminal, while the second TIA includes a second input terminal and a second output terminal. The second TIA is configured such that the second input terminal is operable at any positive voltage level with respect to an applied voltage to a deep n-well for each of the plurality of second CMOS cells.

In a specific embodiment, the first TIA includes a VDDL level and a VSSL level, while the second TIA includes a VDDH level and a VSSH level. Each of the TIAs can be provided with a supply voltage independent of a photodiode differential voltage that is provided on the first and second input terminals. Also, each of the first and second TIAs can include a first switch device configured for at least two bit rates.

The device can include a photodiode coupled between the first and second input terminals. In a specific embodiment, the photodiode is characterized by a responsivity value ranging from about 0.6 to about 0.9 Amps/Watt.

Furthermore, the device can include a LS/DA coupled to the first and second output terminals. In a specific embodiment, the LS/DA can include an up-shifting device and a down-shifting device configured to mitigate any mismatch in data bits between the first and second TIA. The LS/DA includes differential amplifier having a differential voltage output.

In an embodiment, the device can further include a gain amplifier configured to correct any losses provided by either the up-shifting device or the downshifting device. The LS/DA can also be configured with a level shifter.

In an embodiment, the device can further include an AC source coupled to a first capacitor and configured to the first output terminal. The AC source is also coupled to a second capacitor and configured to the second output terminal.

In an embodiment, the device can further include a clock data recovery module coupled to each of the first and second TIA. This clock data recovery module can be configured with the plurality of CMOS cells. The device can also include a digital signal processor module coupled to each of the first and second TIAs.

While the above is a full description of the specific embodiments, various modifications, alternative constructions and equivalents may be used. Therefore, the above description and illustrations should not be taken as limiting the scope of the present invention which is defined by the appended claims.

Figure 4:
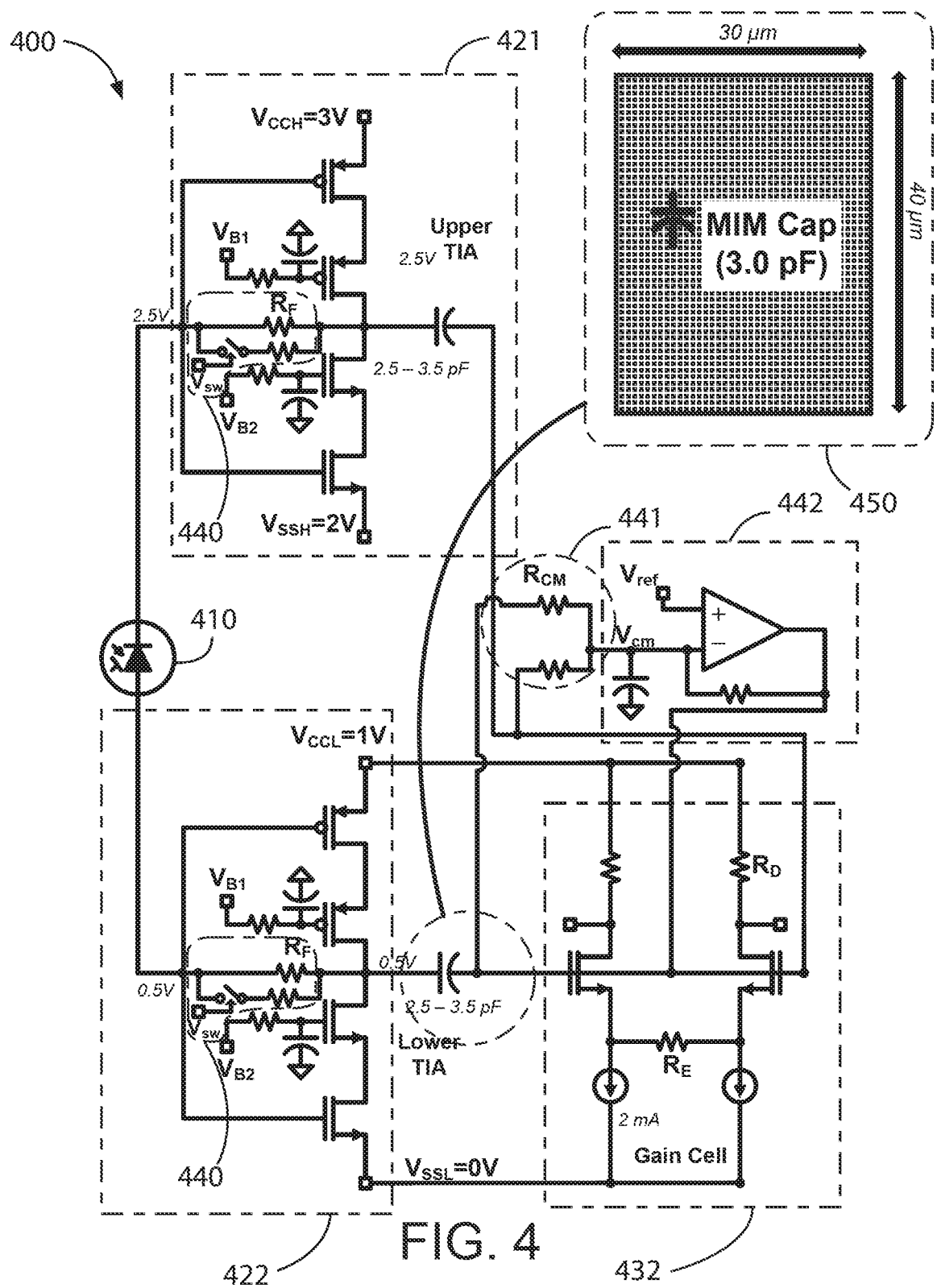
FIG. 4 is a simplified circuit diagram illustrating a fully differential AC-coupled transimpedance amplifier device according to an embodiment of the present invention.

FIG. 4 is a simplified circuit diagram illustrating a fully differential AC-coupled transimpedance amplifier device according to an embodiment of the present invention. As shown, device 400 includes a photodiode 410 coupled to a first TIA 422 and a second TIA 421. The first and second TIAs are coupled to a LS/DA, which includes modules 441, 442, and 432. Each of the TIAs 421/422 includes a switch mechanism 440 including Vsw, a switch element, and Rf resistors. These switches provide dual-mode operations in two different bit rates (e.g. 10 G and 28 G).

The first and second TIAs 421/422 can be AC-coupled with an AC source coupled to a first capacitor and a second capacitor and being configured to the first TIA output and second TIA output, respectively. In a specific embodiment, the first and second capacitor can include a Metal-Insulator-Metal (MIM) capacitors, as shown in item 450. As an example, the MIM cap can have a 3.0 pF capacitance and have a 30×40 micron dimension. The AC-coupled TIA has the benefit of not suffering from Level shifter loss and is better suited to interface with photodiodes requiring greater than 1V biases. Modules 441 and 442 form an Input Common Mode Feedback (ICMFB) module that is coupled to the first and second capacitors and to a gain cell module 432. Various embodiments may include large coupling capacitors and/or large input common mode feedback resistors.

The present invention also provides a system configured on a single integrated circuit (IC) chip device. The system can include a semiconductor substrate including a plurality of CMOS cells. Each of these CMOS cells includes a deep n-type well region. The system includes a TIA module, which includes a first TIA and a second TIA. The first TIA includes a first input terminal and a first output terminal. The first TIA is configured using a plurality of first CMOS cells. The second TIA includes a second input terminal and a second output terminal. The second TIA configured using a plurality of second CMOS cells such that the second input terminal is operable at any positive voltage level with respect to an applied voltage to a deep n-well for each of the plurality of second CMOS cells.

In an embodiment, the system includes a photodiode coupled between the first input terminal and the second input terminal. The photodiode is configured as a discrete device and separate from the first and second TIAs. The system includes an LS/DA coupled to the first and second output terminals. In a specific embodiment, the first and second input terminals are provided with a differential voltage ranging from about 1V to about 5V. Also, the system includes a Clock and Data Recovery (CDR) module coupled to the TIA module, and configured with a plurality of CMOS cells. Of course, there can be other variations, modifications, and alternatives.

FIG. 5 is a simplified table describing characteristics of transimpedance amplifier devices according to various embodiments of the present invention. Table 500 lists example results of a simulated comparison between a 28 nm CMOS TIA, 45 nm CMOS TIA, and a 130 nm Bi-CMOS TIA. The 28 nm CMOS TIA, according to an embodiment of the present invention, is shown to have comparable performance to the 130 nm Bi-CMOS TIA. TIA designs using the 28 nm process provided the best gain and noise characteristics with some power drawbacks. By comparison, the 45 nm TIA designs suffered from poor gain and bandwidth due to low intrinsic gain requiring an additional gain stage. Furthermore, in these examples, the CMOS TIA designs have 10 G/28 G capabilities implemented using switches.

Figures 6A, 6B:
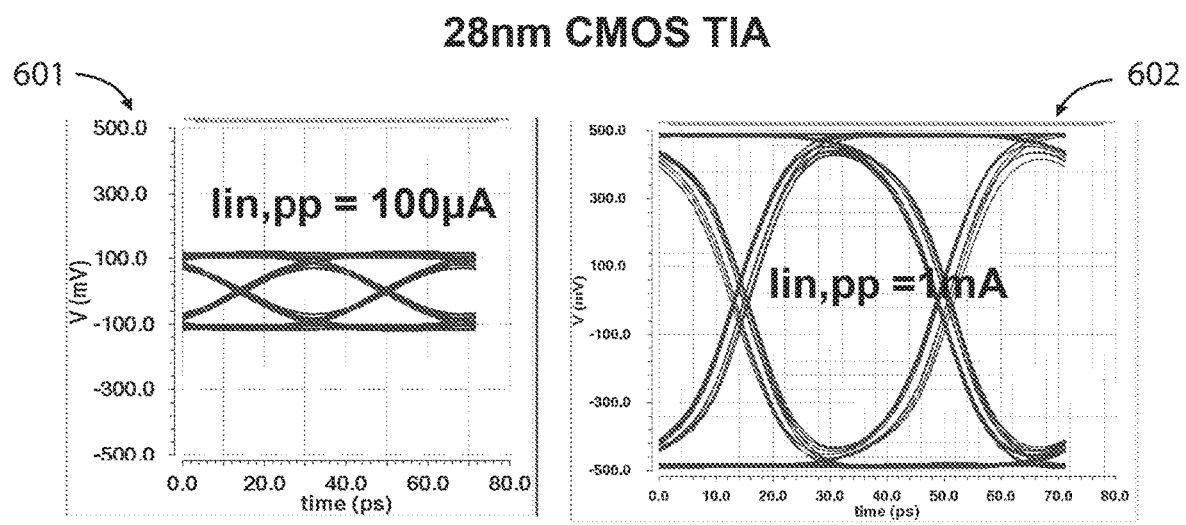
FIGS. 6A and 6B are simplified graphs illustrating a simulation of a 28 nm CMOS TIA according to an embodiment of the present invention.
Figures 6C, 6D:
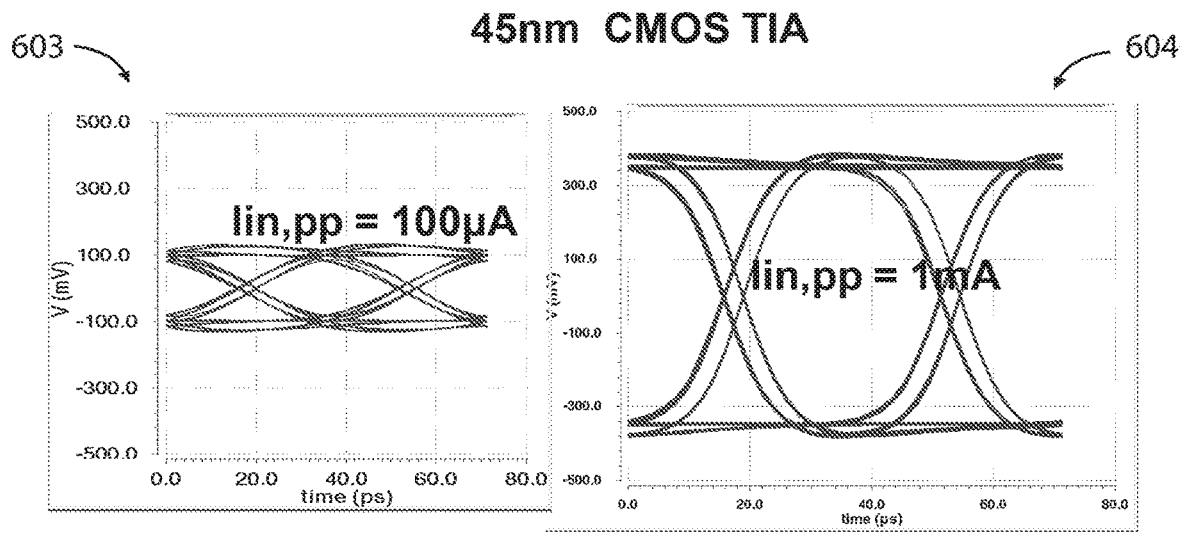
FIGS. 6C and 6D are simplified graphs illustrating simulation of a 45 nm CMOS TIA according to an embodiment of the present invention.

FIGS. 6A and 6B are simplified graphs illustrating a simulation of a 28 nm CMOS TIA according to an embodiment of the present invention. Graph 601 shows a voltage over time simulation with $I_{in,pp}$=100 microAmps and graph 602 shows a voltage over time simulation with $I_{in,pp}$=1 milliAmp. FIGS. 6C and 6D are simplified graphs illustrating simulation of a 45 nm CMOS TIA according to an embodiment of the present invention. Similar to FIGS. 6A and 6B, graph 603 shows a simulation graph with $I_{in,pp}$=100 microAmps, and graph 604 shows a simulation with $I_{in,pp}$=1 milliAmp.

Figure 6E:
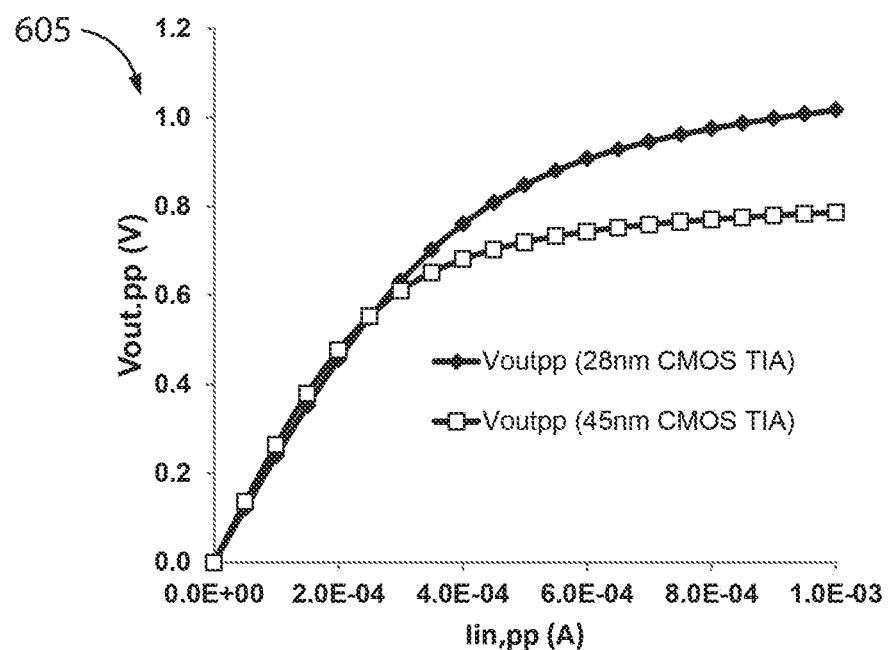
FIG. 6E is a simplified graph illustrating a simulation comparing a 28 nm CMOS TIA and a 45 nm CMOS TIA according to various embodiments of the present invention.

FIG. 6E is a simplified graph illustrating a simulation comparing a 28 nm CMOS TIA and a 45 nm CMOS TIA according to various embodiments of the present invention. This graph 605 shows the simulated differential $V_{out,pp}$ versus $I_{in,pp}$ at 28 Gbps. The higher data deterministic jitter (DDJ) in the 45 nm CMOS TIA is due to poor phase linearity, which is measured with group delay (GD) variation. In order to get higher total bandwidth, the TIA (1' stage) gain is reduced, which results in peaking (less pole splitting) causing higher GD variation (seen at lower swings). The 28 nm CMOS TIA is shown to give better linearity and higher voltage swing compared to the 45 nm CMOS TIA for similar trans-impedance gain (~1.0 kiloOhms) and bandwidth (~17.5 G).

Figure 7:
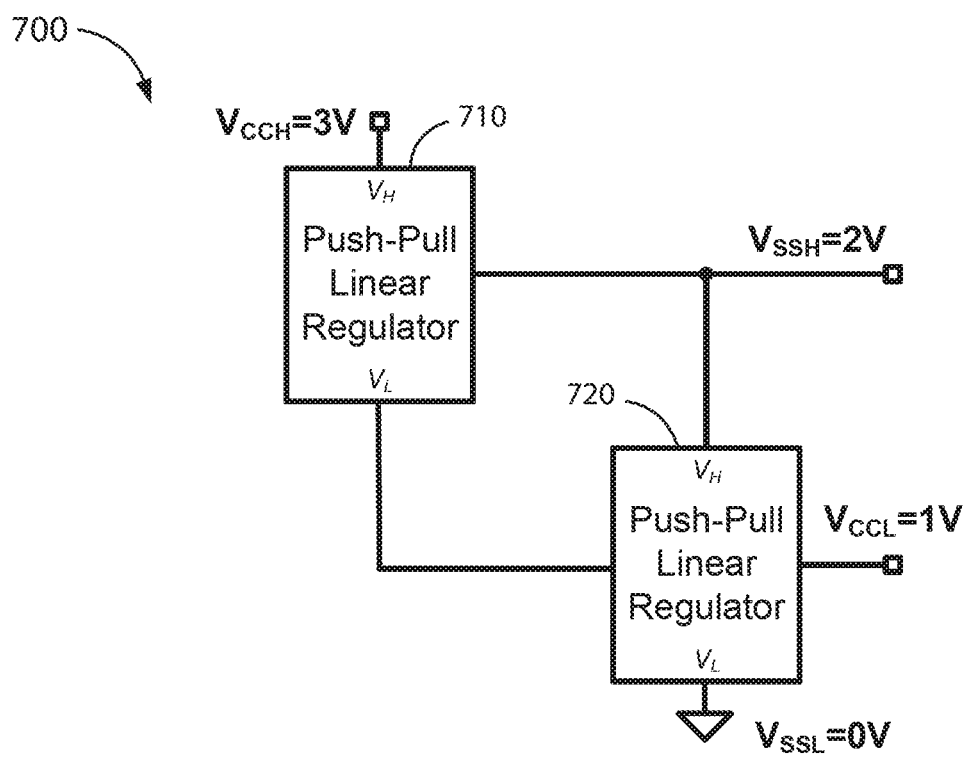
FIG. 7 is a simplified block diagram illustrating a power supply regulator according to an embodiment of the present invention.

FIG. 7 is a simplified block diagram illustrating a power supply regulator according to an embodiment of the present invention. Device 700 is a multi-level power supply regulator module including a pair of push-pull linear regulators 710 and 720. Using a DC-DC down conversion through a charge recycling scheme to support multiple supply domains can save power. For example, the push-pull linear regulators 710, 720 can be stacked to regulate 2V and 1V internal voltages from a 3V reference. By delivering power in a 3V system at 3× the nominal voltage (i.e. 1.0 V), the load current is reduced by 3×. Device 700 can be implemented in various embodiments of the fully differential self-biased TIA devices as described previously.

Figure 8:
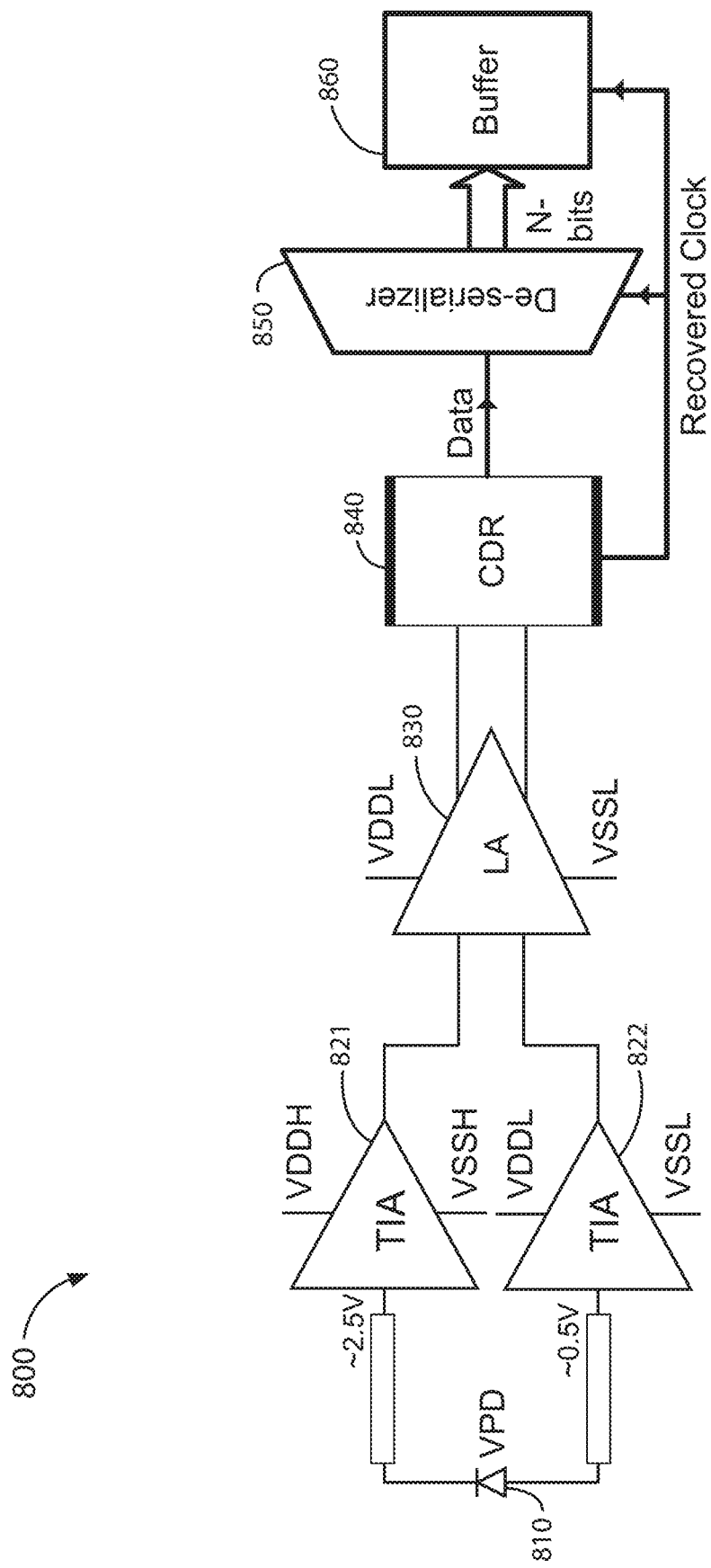
FIG. 8 is a simplified block diagram illustrating a transimpedance amplifier device according to an embodiment of the present invention.

FIG. 8 is a simplified block diagram illustrating a transimpedance amplifier device according to an embodiment of the present invention. As shown, the device 800 includes a photodiode 810 coupled to a differential TIA, which is followed by a Limiting Amplifier (LA) 830. The differential TIA includes a first TIA 822 and a second TIA 821. The first TIA 822 can include a first input terminal and a first output terminal. Similarly, the second TIA 821 can include a second input terminal and a second output terminal. The photodiode 810 is coupled between the first input terminal and the second input terminal. The LA 830 can be coupled to the first output terminal and the second output terminal. The LA 830 is followed by a CDR circuit 840, which sends data to a de-serializer module 850 and to a buffer 860. The CDR circuit 840, de-serializer 850, and the buffer 860 are coupled to a recovered clock. In an embodiment, the de-serializer 850 includes N-bit De-multiplexers from high speed (×1) to lower speed (×1/N) types.

Figure 9:
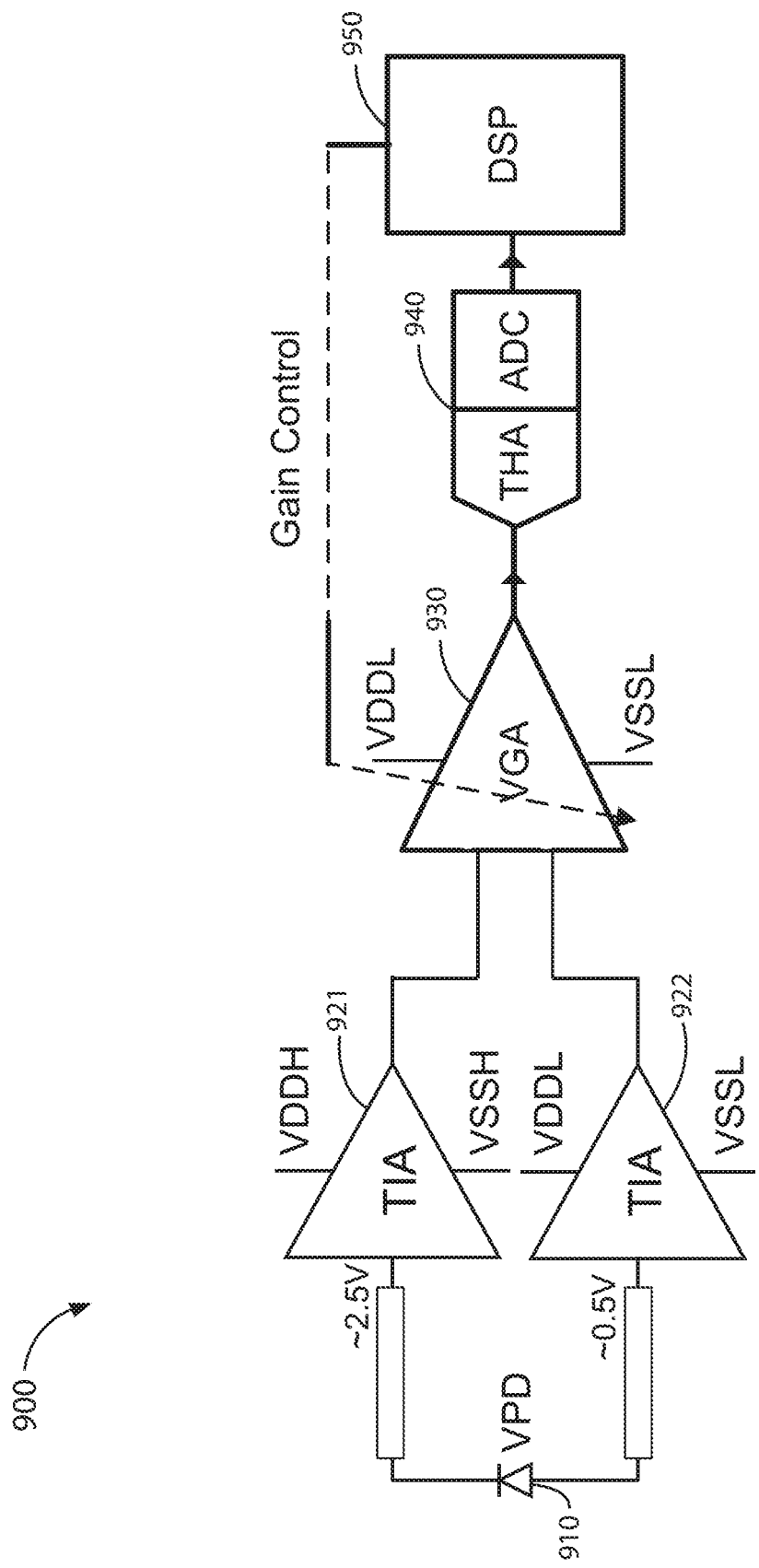
FIG. 9 is a simplified block diagram illustrating a transimpedance amplifier device according to an embodiment of the present invention.

FIG. 9 is a simplified block diagram illustrating a transimpedance amplifier device according to an embodiment of the present invention. As shown, the device 900 includes a photodiode 910 coupled to a differential TIA, which is followed by a Variable Gain Amplifier (VGA) 830. The differential TIA includes a first TIA 922 and a second TIA 921. The first TIA 922 can include a first input terminal and a first output terminal. Similarly, the second TIA 921 can include a second input terminal and a second output terminal. The photodiode 910 is coupled between the first input terminal and the second input terminal. The VGA 930 can be coupled to the first output terminal and the second output terminal. The VGA 930 is followed by a Track and Hold (THA) module coupled to an Analog to Digital Converter (ADC) module. The THA/ADC module is also coupled to a Digital Signal Processor (DSP), which can be configured with the plurality of CMOS cells to perform various functions such as channel estimation and compensation, frequency/phase alignment, and symbol synchronization.

In an embodiment, the present invention provides a system configured on a single IC chip device. The system can be provided on a semiconductor substrate having a plurality of CMOS cells, each of which having a deep n-type well region. The system can include a differential TIA that includes a photodiode coupled to a differential TIA, which is followed by a Level Shifting/Differential Amplifier (LS/DA). The differential TIA includes a first TIA and a second TIA. The first TIA can include a first input terminal and a first output terminal. Similarly, the second TIA can include a second input terminal and a second output terminal. The photodiode is coupled between the first input terminal and the second input terminal, shown at nodes. In a specific embodiment, the photodiode is a discrete device that is separate from the TIA device. The LS/DA can be coupled to the first output terminal and the second output terminal.

In an embodiment, the present invention provides a self-biased differential TIA device. The TIA device includes a semiconductor substrate comprising a plurality of CMOS cells. These CMOS cells can be configured using a 28 nm process technology. Each of the CMOS cells can include a deep n-type well region, as described previously in FIG. 1B. The first TIA can be configured using a plurality of first CMOS cells, while the second TIA can be configured using a plurality of second CMOS cells such that the second input terminal is operable at any positive voltage level with respect to an applied voltage to a deep n-well for each of the plurality of second CMOS cells. In a specific embodiment, the differential voltage provided across the first and second input terminals ranges from about 1 volt to about 5 volts.

Using the deep n-well regions, the differential TIA can be self-biased with customizable bias voltages at the TIA inputs. Any positive voltage level can be used (2V, 3V, 5V, etc.) as long as there is 1V across the TIA and there is a differential voltage between the inputs of the first and second TIA of at least 2-5V. The photodiode can be characterized by a responsivity value ranging from about 0.6 to about 0.9 Amps/Watt.

In a specific embodiment, each of the first TIA and the second TIA can be provided with a supply voltage that is independent of a photodiode differential voltage provided on the first input terminal and the second input terminal. The first TIA includes a VDDL level and a VSSL level while the second TIA includes a VDDH level and a VSSH level. The LS/DA is also shown with a VDDL level and a VSSL level. Due to the self-biased configuration of the TIAs, these upper and lower supply voltages can be independent of the photodiode bias voltage or the photodiode differential voltage. Specific configurations of this system can be similar to the embodiments depicted in FIGS. 3 and 4.

In an embodiment, the present invention provides a self-biased fully differential TIA designed in a 1V deep submicron. As CMOS technology scales, operating supply voltages are self-biased. An automatic clock phase adjustment architecture for synchronization of multiple high-speed is also provided.

Future 1 THz and 400 GHz Optical Fiber Links will have multiple channels with 28 G and 10 G Optical Receivers (Rx) on a single silicon chip implemented in a high-speed deep-submicron CMOS technology. As CMOS technology is scaled down to make circuits and systems run at higher speed and occupy smaller chip (die) area, the operating supply voltage is reduced for lower power. Conventional FET transistors in deep-submicron CMOS processes have very low breakdown voltage, as a result the operating supply voltage is maintained around 1 Volt. The Photo-detectors (PD) used in 28 G and 10 G Optical Receivers require a bias voltage of more than 2 Volts across the anode and cathode nodes of the PD for better photo-current responsivity.

Typically, in existing high speed TIA's the PD is AC-coupled to the trans-impedance amplifier (TIA) and/or external voltage is used to bias the PD. AC-coupling between PD and TIA reduces the system sensitivity. Moreover, with multiple channels (over 50 channels in conventional embodiments) the external bias circuits add to the system complexity and increases the module cost. Embodiments of the present invention eliminate the need of external bias circuits and all bias voltages to the PD will be internally generated by the CMOS TIA. Additionally, the architecture described here AC-couples the PD to the TIA reducing noise and improving sensitivity.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A circuit device comprising:
   a semiconductor substrate comprising a plurality of CMOS cells, each of the CMOS cells comprising a deep n-type well region;
   a first transimpedance amplifier (TIA) comprising a first input terminal and a first output terminal, the first TIA configured using a plurality of first CMOS cells; and
   a second TIA comprising a second input terminal and a second output terminal, the second TIA configured using a plurality of second CMOS cells such that the second input terminal is operable at any positive voltage level with respect to an applied voltage to a deep n-well for each of the plurality of second CMOS cells.

2. The device of claim 1 wherein the plurality of CMOS cells is configured using a 28 nm process technology.

3. The device of claim 1 wherein each of the first TIA and the second TIA is provided with an independent supply; and wherein each of the first TIA and the second TIA includes a first switch device configured for at least two bit rates.

4. The device of claim 1 further comprising an AC source coupled to a first capacitor and configured to the first output terminal; and the AC source coupled to a second capacitor and configured to the second output terminal.

5. The device of claim 1 further comprising a clock data recovery module coupled to each of the first TIA and the second TIA, the clock data recovery module configured with the plurality of CMOS cells.

6. The device of claim 1 further comprising a digital signal processor module coupled to each of the first TIA and the second TIA.

7. The device of claim 1 wherein the first TIA and the second TIA are self-biased.

8. A communication system comprising:
- a semiconductor substrate comprising a plurality of CMOS cells, each of the CMOS cells comprising a deep n-type well region;
- a transimpedance amplifier (TIA) module comprising:
- a first TIA comprising a first input terminal and a first output terminal, the first TIA configured using a plurality of first CMOS cells;
- a second TIA comprising a second input terminal and a second output terminal, the second TIA configured using a plurality of second CMOS cells such that the second input terminal is operable at any positive voltage level with respect to an applied voltage to a deep n-well for each of the plurality of second CMOS cells; and
- a communication link.

9. The system of claim 8 wherein the plurality of CMOS cells is configured using a 28 nm process technology.

10. The system of claim 8 wherein each of the first TIA and the second TIA is provided with an independent supply voltage; and wherein each of the first TIA and the second TIA includes a first switch device configured for at least two bit rates.

11. The system of claim 8 further comprising an AC source coupled to a first capacitor and configured to the first output terminal; and the AC source coupled to a second capacitor and configured to the second output terminal.

12. The system of claim 8 further comprising a digital signal processor module coupled to each of the first TIA and second TIA, and configured with a plurality of CMOS cells.

13. The system of claim 8 further comprising a clock data recovery module coupled to each of the first TIA and the second TIA, the clock data recovery module configured with the plurality of CMOS cells.

14. A differential transimpedance amplifier (TIA) circuit device comprising:
- a semiconductor substrate comprising a plurality of CMOS cells, each of the CMOS cells comprising a deep n-type well region;
- a first TIA comprising a first input terminal and a first output terminal, the first TIA configured using a plurality of first CMOS cells;
- a second TIA comprising a second input terminal and a second output terminal, the second TIA configured using a plurality of second CMOS cells such that the second input terminal is operable at any positive voltage level with respect to an applied voltage to a deep n-well for each of the plurality of second CMOS cells; and
- a photodiode coupled between the first input terminal and the second input terminal.

15. The device of claim 14 wherein the plurality of CMOS cells is configured using a 28 nm process technology; and wherein each of the first TIA and the second TIA includes a first switch device configured for at least two bit rates.

16. The device of claim 14 wherein each of the first TIA and the second TIA is provided with a supply voltage independent of a photodiode differential voltage provided on the first input terminal and the second input terminal.

17. The device of claim 14 further comprising an AC source coupled to a first capacitor and configured to the first output terminal; and the AC source coupled to a second capacitor and configured to the second output terminal.

18. The device of claim 14 further comprising a clock data recovery module coupled to each of the first TIA and the second TIA, the clock data recovery module configured with the plurality of CMOS cells.

19. The device of claim 14 further comprising a digital signal processor module coupled to each of the first TIA and the second TIA.

20. The device of claim 14 wherein the first TIA and the second TIA are self-biased.

\* \* \* \* \*